US011346876B2

(12) United States Patent
Bauer

(10) Patent No.: US 11,346,876 B2
(45) Date of Patent: May 31, 2022

(54) ELECTRICAL SENSOR ASSEMBLY

(71) Applicant: G & W Electric Company, Bolingbrook, IL (US)

(72) Inventor: Alberto Bauer, Dubai (AE)

(73) Assignee: G & W Electric Company, Bolingbrook, IL (US)

( * ) Notice: Subject to any disclaimer, the term of this patent is extended or adjusted under 35 U.S.C. 154(b) by 0 days.

(21) Appl. No.: 17/414,891

(22) PCT Filed: Dec. 17, 2019

(86) PCT No.: PCT/US2019/066906
§ 371 (c)(1),
(2) Date: Jun. 16, 2021

(87) PCT Pub. No.: WO2020/131909
PCT Pub. Date: Jun. 25, 2020

(65) Prior Publication Data
US 2022/0043044 A1 Feb. 10, 2022

(30) Foreign Application Priority Data

Dec. 17, 2018 (IT) .................. 102018000011149
Dec. 17, 2018 (IT) .................. 202018000003944

(51) Int. Cl.
*G01R 15/14* (2006.01)
*G01R 15/16* (2006.01)
(Continued)

(52) U.S. Cl.
CPC ....... *G01R 29/0878* (2013.01); *G01R 15/144* (2013.01); *G01R 29/12* (2013.01); *H01B 9/006* (2013.01)

(58) Field of Classification Search
CPC .. G01R 29/0878; G01R 15/144; G01R 15/16; G01R 15/165; G01R 29/12;
(Continued)

(56) References Cited

U.S. PATENT DOCUMENTS 3,835,353 A 9/1974 Hermstein et al.
4,241,373 A 12/1980 Mara et al.
(Continued)

FOREIGN PATENT DOCUMENTS

GB 967853 A 8/1964
WO 2010070693 A1 6/2010
(Continued)

OTHER PUBLICATIONS

International Preliminary Report on Patentability for Application No. PCT/IT2019/000023 dated Oct. 15, 2020 (7 pages).
(Continued)

*Primary Examiner* — Jermele M Hollington
*Assistant Examiner* — Suresh K Rajaputra
(74) *Attorney, Agent, or Firm* — Michael Best & Friedrich LLP

(57) ABSTRACT

A sensor assembly includes a connecting bar extending along a longitudinal axis and a tubular body extending along the longitudinal axis and at least partially surrounding the connecting bar such that the tubular body is radially spaced from the connecting bar. The tubular body includes a first skirt portion, a first plurality of cantilevered tabs extending from the first skirt portion in a first direction parallel to the longitudinal axis, a second skirt portion, and a second plurality of cantilevered tabs extending from the second skirt portion in a second direction opposite the first direction.

21 Claims, 4 Drawing Sheets

(51) Int. Cl.
*G01R 29/08* (2006.01)
*H01B 9/00* (2006.01)
*G01R 29/12* (2006.01)

(58) Field of Classification Search
CPC ............... G01R 19/0092; G01R 1/203; G01R 31/2642; H01B 9/006; G06F 9/3802; G06F 2221/2137
See application file for complete search history.

(56) References Cited

U.S. PATENT DOCUMENTS

| | | | |
|---|---|---|---|
| 4,268,889 A | 5/1981 | Wolfendale | |
| 4,700,123 A | 10/1987 | Beling | |
| 5,991,177 A | 11/1999 | Kaczkowski | |
| 7,466,146 B2 | 12/2008 | Stewart et al. | |
| 9,291,651 B2 | 3/2016 | Bauer | |
| 9,568,506 B2 | 2/2017 | Fujinoki | |
| 9,696,348 B2 | 7/2017 | Juds et al. | |
| 9,921,246 B2 | 3/2018 | Bauer | |
| 2001/0048308 A1 | 12/2001 | Potter et al. | |
| 2006/0033508 A1 | 2/2006 | Lee | |
| 2006/0119369 A1 | 6/2006 | Kawahata et al. | |
| 2011/0121820 A1 | 5/2011 | Handshoe et al. | |
| 2011/0204879 A1 | 8/2011 | Peretto | |
| 2012/0261384 A1 | 10/2012 | Labianco et al. | |
| 2013/0043891 A1 | 2/2013 | Handshoe et al. | |
| 2014/0300374 A1 | 10/2014 | Mckenzie et al. | |
| 2016/0139181 A1 | 5/2016 | Gravermann et al. | |
| 2016/0245845 A1* | 8/2016 | Alberto | B29C 39/10 |
| 2017/0030946 A1 | 2/2017 | Gravermann et al. | |
| 2017/0038414 A1 | 2/2017 | Barba Jimenez | |
| 2017/0234908 A1 | 8/2017 | Gravermann et al. | |
| 2017/0363660 A1 | 12/2017 | Gravermann | |
| 2019/0234995 A1* | 8/2019 | Peretto | G01R 15/165 |
| 2020/0256896 A1* | 8/2020 | Bauer | G01R 15/165 |
| 2021/0018537 A1* | 1/2021 | Bauer | G01R 15/06 |
| 2021/0072289 A1* | 3/2021 | Peretto | G01R 15/165 |

FOREIGN PATENT DOCUMENTS

| | | |
|---|---|---|
| WO | 2018069949 A2 | 10/2017 |
| WO | 2018096567 A2 | 5/2018 |
| WO | 2019073497 A1 | 4/2019 |
| WO | 2019186607 A1 | 10/2019 |
| WO | 2020131903 A1 | 6/2020 |

OTHER PUBLICATIONS

International Preliminary Report on Patentability for Application No. PCT/US2019/066899 dated Jul. 1, 2021 (9 pages).
International Preliminary Report on Patentability for Application No. PCT/US2019/066906 dated Jul. 1, 2021 (7 pages).
International Search Report and Written Opinion and Application No. PCT/US2019/066906 dated Mar. 18, 2020 (7 pages).
International Search Report and Written Opinion for Application No. PCT/IT2019/000023 dated Jul. 26, 2019 (9 pages).
International Search Report and Written Opinion for Application No. PCT/US2019/053525 dated Jun. 29, 2020 (12 pages).
International Search Report and Written Opinion for Application No. PCT/US2019/066899 dated Mar. 5, 2020 (10 pages).

* cited by examiner

ELECTRICAL SENSOR ASSEMBLY

CROSS-REFERENCE TO RELATED APPLICATIONS

This application claims priority to Italian Patent Application No. 102018000011149, filed Dec. 17, 2018, and to Italian Utility Model Application No. 202018000003944, filed Dec. 17, 2018, the entire contents of both of which are incorporated herein by reference.

FIELD OF THE DISCLOSURE

The present disclosure relates to an electrical sensor assembly, preferably intended for electrical transformers, electrical cabinets and other similar structures, that enables the electric field generated by a live connecting bar to be detected, for example to detect the voltage value of said connecting bar in relation to the detected electric field.

More specifically, the present disclosure relates to a sensor assembly that may detect the electric field generated by the connecting bar without being influenced by any surrounding electrical fields, such as the fields generated by other conductors arranged nearby.

BACKGROUND

Electrical sensor assemblies of the aforementioned type are known, but suffer from a series of drawbacks.

A first drawback is that said known sensor assemblies do not enable the electric field generated by the connecting bar to be detected without being influenced by other surrounding fields.

A second drawback is that said known sensor assemblies are somewhat large.

A third drawback is that said known sensor assemblies do not enable electrical fields and/or related magnitudes to be measured with sufficient accuracy.

A fourth drawback is that said known sensor assemblies are not immune to surrounding electrical fields generated, for example, by other conductors arranged nearby.

A fifth drawback is that said known sensor assemblies do not enable electrical fields and/or related magnitudes to be measured with sufficient accuracy in the presence of temperature variations.

A sixth drawback is that said known sensor assemblies do not retain over time the technical features required to perform the function of the sensor assembly and/or to maintain the required safety level (partial discharges, detachment, rapid ageing, etc.).

A seventh drawback is that said known sensor assemblies are complex and costly to make.

An eighth drawback is that, in said known sensor assemblies, the resin of dielectric material placed about the components of the sensor assembly have cavities (air bubbles), which results in unwanted partial discharging.

A ninth drawback is that, in said known sensor assemblies, said resin is detached from the elements that comprise the capacitive sensor, which results in unwanted partial discharging.

A tenth drawback is that, in said known sensor assemblies, said resin is not perfectly bonded and/or stuck and/or linked to the components that form the sensor assembly and consequently, ageing causes said resin to become detached from said members, which results in unwanted partial discharging. This drawback is particularly common where the sensor assembly is used in an environment in which the operating temperature (hot/cold) varies cyclically.

SUMMARY

Sensor assemblies according to embodiments of the present disclosure may advantageously resolve one or more of the aforementioned drawbacks.

For example, the present disclosure provides, in one aspect, a sensor assembly including a connecting bar extending along a longitudinal axis and a tubular body extending along the longitudinal axis and at least partially surrounding the connecting bar such that the tubular body is radially spaced from the connecting bar. The tubular body includes a first skirt portion, a first plurality of cantilevered tabs extending from the first skirt portion in a first direction parallel to the longitudinal axis, a second skirt portion, and a second plurality of cantilevered tabs extending from the second skirt portion in a second direction opposite the first direction.

The present disclosure provides, in another aspect, a sensor assembly including a connecting bar extending along a longitudinal axis and a tubular body extending along the longitudinal axis and at least partially surrounding the connecting bar such that the tubular body is radially spaced from the connecting bar. The tubular body includes a support member made of an insulating material, the support member including an inner surface and an outer surface opposite the inner surface, an electric field sensor comprising a first layer of electrically conductive material disposed on the inner surface of the support member, the electric field sensor configured to detect an electric field produced by the connecting bar, a first electric screen comprising a second layer of electrically conductive material disposed on the outer surface of the support member, the first electric screen configured to shield the electric field sensor from outside electrical interference, and a plurality of cantilevered tabs having a first tab and a second tab spaced from the first tab to define a through hole therebetween. The through hole extends through support member, the first layer, and the second layer.

The present disclosure provides, in another aspect, a sensor assembly including a tubular body extending along a longitudinal axis. The tubular body includes a support member made of an insulating material, a first layer of electrically conductive material disposed on an inner surface of the support member, a second layer of electrically conductive material disposed on an outer surface of the support member, a first skirt portion, a first plurality of cantilevered tabs extending from the first skirt portion in a first direction parallel to the longitudinal axis, a second skirt portion, a second plurality of cantilevered tabs extending from the second skirt portion in a second direction opposite the first direction, and a connecting segment extending between and interconnecting the first skirt portion and the second skirt portion.

Other features and aspects of the disclosure will become apparent by consideration of the following detailed description and accompanying drawings.

Before any embodiments of the disclosure are explained in detail, it is to be understood that the disclosure is not limited in its application to the details of construction and the arrangement of components set forth in the following description or illustrated in the following drawings. The disclosure is capable of other embodiments and of being practiced or of being carried out in various ways. Also, it is to be understood that the phraseology and terminology used herein is for the purpose of description and should not be regarded as limiting.

DETAILED DESCRIPTION

Figure 1:
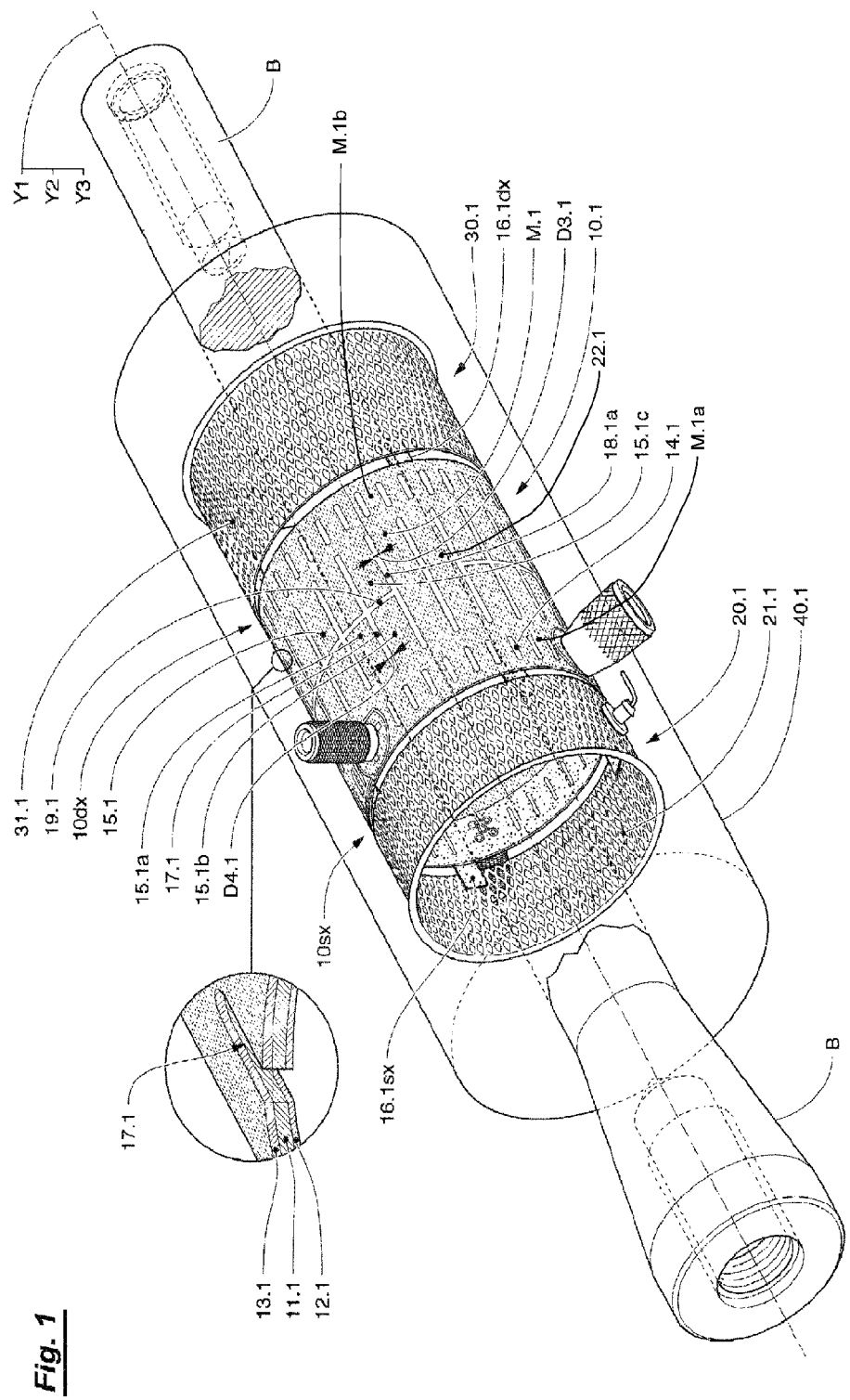
FIG. 1 is a schematic view of a first embodiment of a sensor assembly according to the present disclosure.
Figure 2:
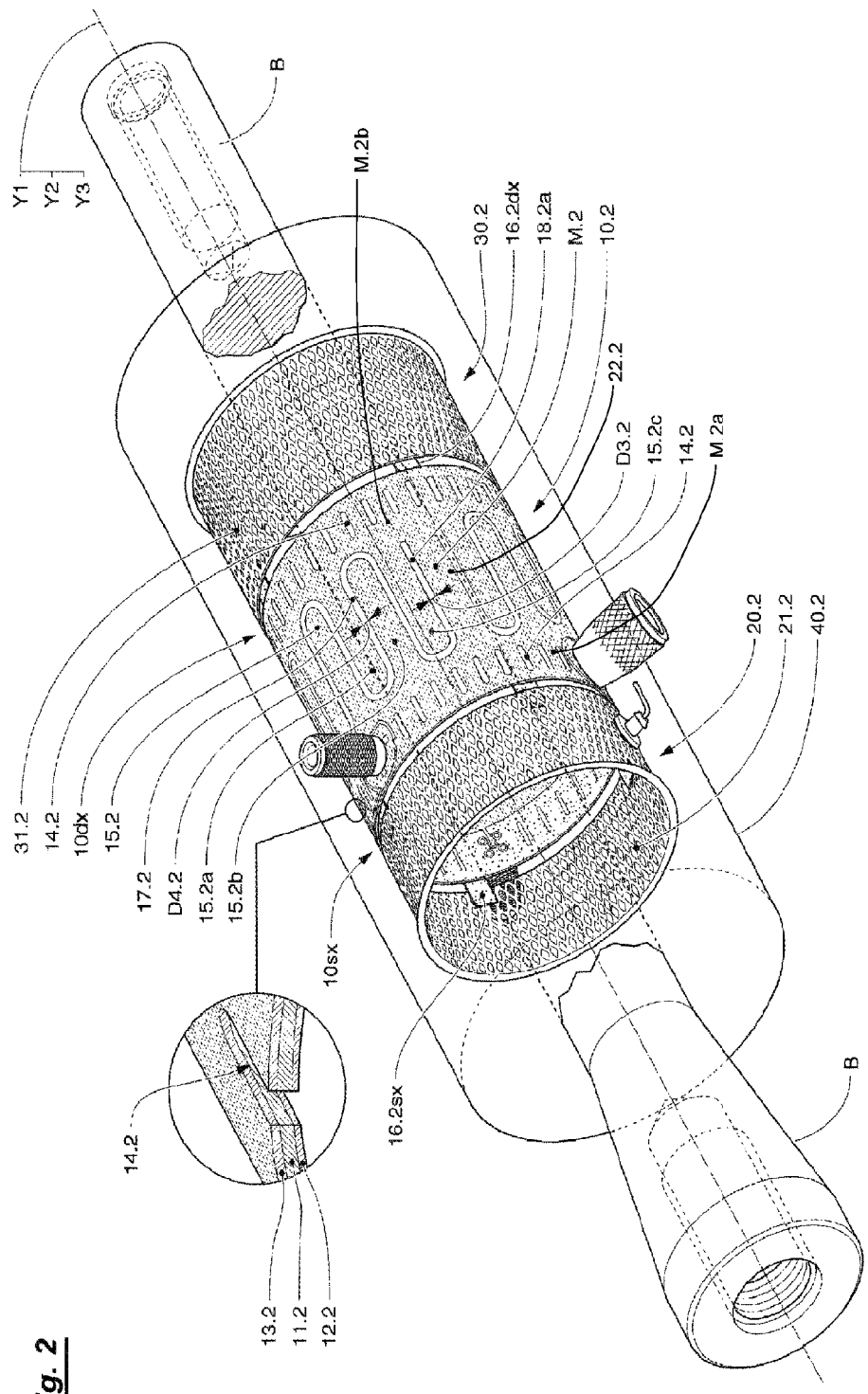
FIG. 2 is a schematic view of a second embodiment of a sensor assembly according to the present disclosure.
Figure 2A:
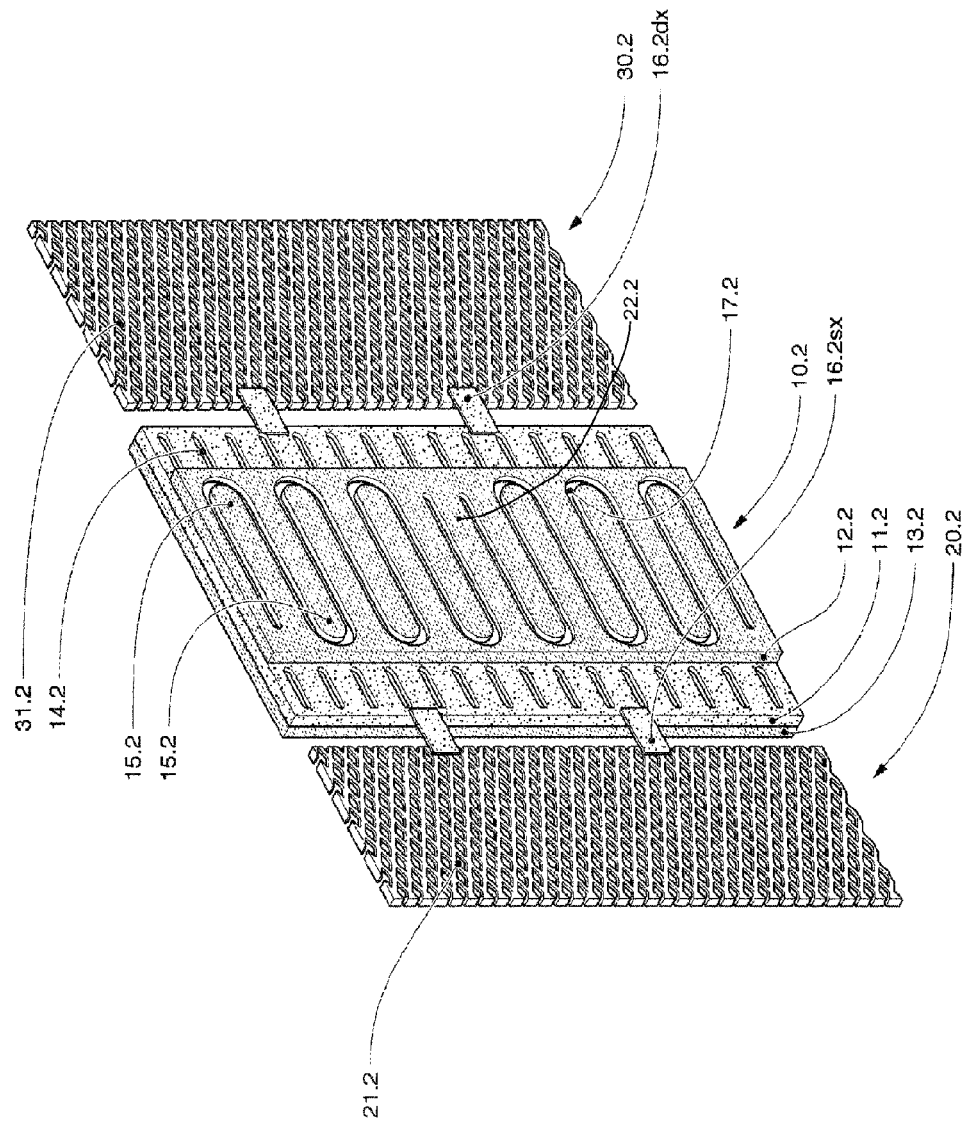
FIG. 2A is a schematic view of a tubular body in the embodiment in FIG. 2, laid flat.

With reference to FIGS. 1-2A, an electrical sensor assembly according to embodiments of the present disclosure extends along a first longitudinal axis Y1 and substantially comprises: a connecting bar B extending longitudinally along a respective second longitudinal axis Y2; a tubular body extending longitudinally along a third longitudinal axis Y3; a mass of dielectric material 40 designed to at least partially enclose the components of the sensor assembly; in which the tubular body is positioned coaxially about said central connecting bar B and is spaced radially apart from said central connecting bar B; in which said tubular body has one or more cantilevered tabs 15.1, 15.1a, 15.1b, 15.1c/15.2, 15.2a, 15.2b, 15.2c.

Particular reference is made to said tubular body, which can include a first tubular section 10.1/10.2 comprising: a first self-supporting tubular laminar element or structural member 11.1/11.2 made of insulating material, a first thin layer of electrically conductive material 12.1/12.2 applied to one or more inner faces of said first self-supporting tubular laminar element 11.1/11.2; and a second thin layer of electrically conductive material 13.1/13.2 applied to one or more outer faces of said first self-supporting tubular laminar element 11.1/11.2.

The first self-supporting tubular laminar element 11.1/11.2 may function as a supporting structure for the layers of conductive material. The first thin layer of electrically conductive material 12.1/12.2 may function as an electric field sensor and, more specifically, may detect the electric field generated by the connecting bar B by means of capacitive coupling between said bar B and said layer 12.1/12.2.

The second thin layer of electrically conductive material 13.1/13.2 may function as an electric screen, for example by connecting to ground or to a known potential, and, more specifically, an electric screen able to shield or screen the electric field sensor formed by the first thin layer of electrically conductive material 12.1/12.2 from external electric fields, such as from electric field lines generated by any live conductors arranged outside the tubular body.

Said tubular body and/or said first tubular section 10.1/10.2 can include a skirt M.1/M.2 and a plurality of cantilevered tabs 15.1/15.2 extending from the skirt M.1/M.2. In the illustrated embodiment, the skirt M.1/M.2 includes a first skirt portion M.1a/M.2a and a second skirt portion M.1b/M.2b disposed at opposite ends of the first tubular section 10. One or more cantilevered tabs 15.1, 15.1a, 15.1b/15.2b (e.g., a first plurality of tabs) may extend from the first skirt portion M.1a/M.2a in a first direction parallel to the axes Y1/Y2/Y3, and one or more cantilevered tabs 15.1c/15.2a, 15.2c (e.g., a second plurality of tabs) may extend from the second skirt portion M.1b/M.2b in a second direction generally opposite the first direction (FIGS. 1 and 2). In some embodiments, the tubular body and/or the first tubular section 10.1/10.2 may include one or more connecting segments 22.1/22.2 that extend between and interconnect the first and second skirt portions M.1a, M.1b/M.2a, M.2b.

The edges of said tabs 15.1c/15.2c are spaced apart by a distance D3.1/D3.2 from the connecting segments 22.1/22.2 in order to form first through-openings 18.1a/18.2a, which are preferably wide enough to enable a resin of dielectric material in liquid/paste state to pass and/or flow therethrough.

The tabs 15.1a, 15.1b/15.2a, 15.2b can be positioned side by side, as illustrated in FIGS. 2-2A, in which preferably the edge of a first tab 15.1a/15.2a is spaced apart by a distance D4.1/D4.2 circumferentially from the edge of a second tab 15.1b/15.2b positioned beside said first tab 15.1a/15.2a, in order to form second through-openings 17.1/17.2, which are preferably wide enough to enable a resin of dielectric material in liquid/paste state to pass and/or flow through said second through-openings 17.1/17.2.

Figure 1A:
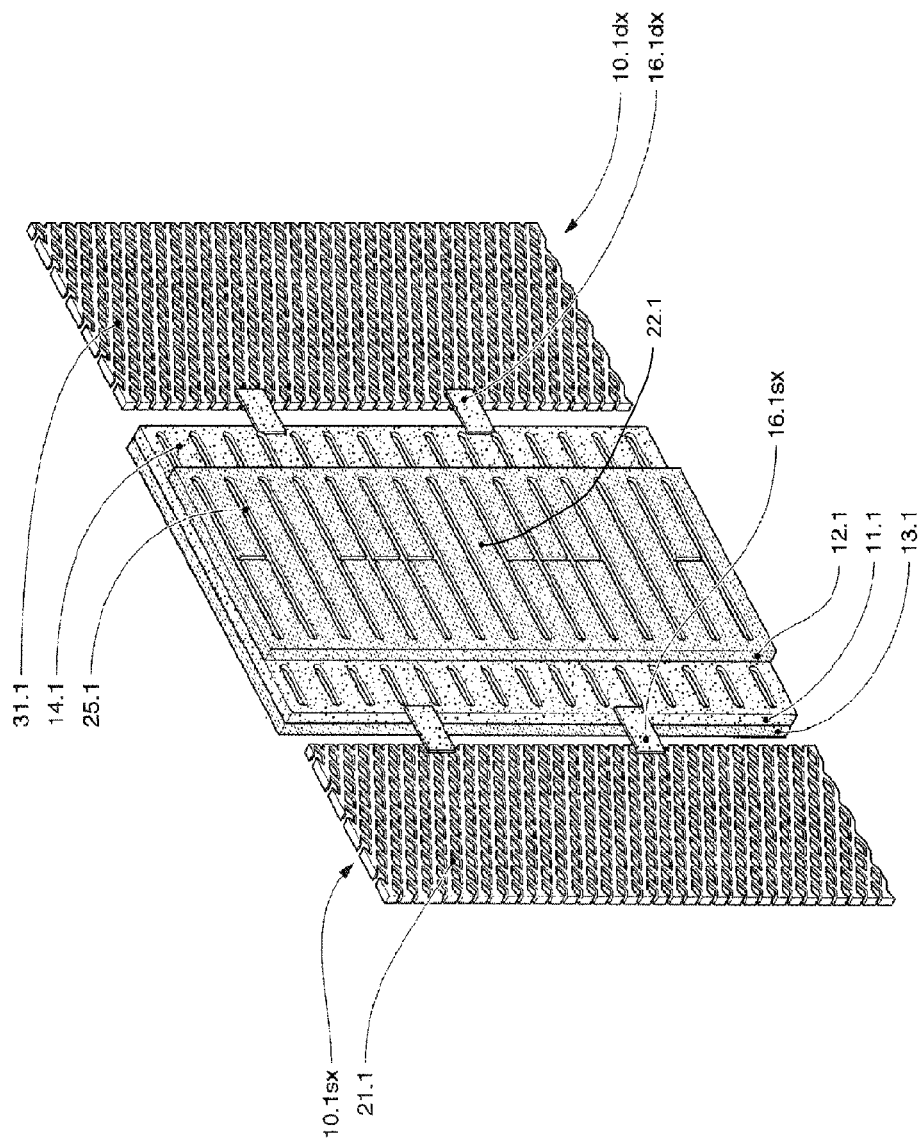
FIG. 1A is a schematic view of a tubular body in the embodiment in FIG. 1, laid flat.

With reference to FIGS. 1 and 1A, the tabs 15.1b and 15.1c can be positioned against one another, with the respective free ends thereof arranged end-to-end and preferably spaced apart axially from one another, in order to form third through-openings 19.1, which are preferably wide enough to enable a resin of dielectric material in liquid/paste state to pass and/or flow through said third through-openings 19.1.

With reference to FIGS. 2 and 2A, the tabs 15.2a, 15.2b, 15.2c can be positioned side by side, with the respective free ends thereof positioned against one another, in which the respective free end of one or more tabs 15.2a, 15.2b, 15.2c is rounded.

With reference to FIGS. 1-2A, said tabs 15.1, 15.1a, 15.1b, 15.1c/15.2, 15.2a, 15.2b, 15.2c are preferably flexible and also preferably have a degree of flexibility selected in consideration of the shrinkage characteristics of the resin used in the casting, in order to follow the shrinkage of the resin during the solidification phases of said resin.

The tubular body provided with cantilevered tabs 15.1, 15.1a, 15.1b, 15.1c/15.2, 15.2a, 15.2b, 15.2c can be made in a variety of ways and/or using a variety of materials without thereby moving outside the scope of the inventive concepts covered by the present disclosure, for example using preformed tubes with one or more layers that are subjected to mechanical machining to form the tabs, using individual sheets and/or one or more sheets, of metal, of mesh, using electrically conductive material or electrically insulating material.

With particular reference to FIGS. 1A and 2A, the first tubular section 10.1/10.2 can preferably be made from a single conductive double-sided Vetronite board (for example a copper double-sided Vetronite board—PCB), for example etched by photoengraving or mechanical milling, as shown in FIGS. 1A and 2A, and then wrapped into a tube shape, as shown in FIGS. 1 and 2, in which said conductive double-sided Vetronite board (for example a copper double-sided Vetronite board—PCB) includes a Vetronite lamina 11.1/11.2 able to form the self-supporting tubular body, an inner layer 12.1/12.2 of conductive material able to form the electric field sensor, and an outer layer 13.1/13.2 of conductive material, preferably connected to ground, able to form an electric screen.

The sensor assembly according to the present disclosure can also include a second tubular section 20.1/20.2 that may function as an electric screen and is positioned axially beside a first axial end 10sx of the first tubular section 10.1/10.2, as well as a third tubular section 30.1/30.2 that is also able to perform the function of an electric screen and is positioned axially beside a second axial end 10*dx* of the first tubular section 10.1/10.2.

Said second tubular section 20.1/20.2 and/or said third tubular section 30.1/30.2 can be made of wire mesh. Preferably, said second tubular section 20.1/20.2 and/or said third tubular section 30.1/30.2 are associated with and/or linked to said first tubular section 10.1/10.2 using connection members, such as fastening appendages 16.1*sx*, 16.1*dx*/16.2*sx*, 16.2*dx*.

Where desired, said first tubular section 10.1/10.2 and/or said second tubular section 20.1/20.2 and/or said third tubular section 30.1/30.2 can have one or more additional fourth through-openings, 14.1, 21.1, 31.1/14.2, 21.2, 31.2, which are preferably wide enough to enable a resin of dielectric material in liquid/paste state to pass through said additional fourth through-openings. Again where desired, said second tubular section 20.1/20.2 and/or said third tubular section 30.1/30.2 can also perform the function of an electric field sensor able to detect the presence or absence of voltage on the connecting bar B.

Although the disclosure has been described in detail with reference to certain preferred embodiments, variations and modifications exist within the scope and spirit of one or more independent aspects of the disclosure as described. In addition, some aspects of the present disclosure may include, but are not limited to:

Aspect 1. A sensor assembly relating to a through isolator, wherein said sensor assembly extends along a first longitudinal axis (Y1), wherein said sensor assembly comprises: a connecting bar (B) extending longitudinally along a respective second longitudinal axis (Y2); a tubular body extending longitudinally along a third longitudinal axis (Y3); a mass of dielectric material (40) able to incorporate at least partially the components of the sensor assembly; wherein said tubular body is positioned coaxially around said central connecting bar (B); wherein said tubular body is radially spaced with respect to said central connecting bar (B); characterized by the fact that said tubular body comprises one or more tabs (15.1, 15.1*a*, 15.1*b*, 15.1*c*/15.2, 15.2*a*, 15.2*b*, 15.2*c*) supported in a cantilever manner.

Aspect 2. A sensor assembly relating to a through isolator, wherein said sensor assembly extends along a first longitudinal axis (Y1), wherein said sensor assembly comprises: a connecting bar (B) extending longitudinally along a respective second longitudinal axis (Y2); a tubular body extending longitudinally along a third longitudinal axis (Y3); a mass of dielectric material (40) able to incorporate at least partially the components of the sensor assembly; wherein said tubular body is positioned coaxially around said central connecting bar (B); wherein said tubular body is radially spaced with respect to said central connecting bar (B); characterized by the fact that said tubular body comprises a first tubular section (10.1/10.2) comprising: a first self-supporting tubular laminar element (11.1/11.2) made of insulating material; a first thin layer of electrically conductive material (12.1/12.2) applied on one or more inner faces of said first self-supporting tubular laminar element (11.1/11.2); a second thin layer of electrically conductive material (13.1/13.2) applied on one or more external faces of said first self-supporting tubular laminar element (11.1/11.2); by the fact that said first self-supporting tubular laminar element (11.1/11.2) is adapted to perform the function of supporting structure; by the fact that said first thin layer of electrically conductive material (12.1/12.2) may function as an electric field sensor; by the fact that said second thin layer of electrically conductive material (13.1/13.2) may function as an electric screen; and by the fact that said first tubular section (10.1/10.2) comprises one or more tabs (15.1, 15.1*a*, 15.1*b*, 15.1*c*/15.2, 15.2*a*, 15.2*b*, 15.2*c*) supported in an cantilever manner.

Aspect 3. A sensor assembly according to aspect 1 or 2, characterized by the fact that said tabs (15.1*c*/15.2*c*) have their edge spaced (D3.1, D3.2) with respect to the skirt (M.1, M.2) which forms the relative tubular section (10.1, 10.2) in order to form first through openings (18.1*a*, 18.2*a*).

Aspect 4. A sensor assembly according to aspect 1 or 2, characterized by the fact to comprise two or more tabs (15.1*a*, 15.1*b*/15.2*a*, 15.2*b*) positioned side by side to each other.

Aspect 5. A sensor assembly according to aspect 4, characterized by the fact that the edge of a first tab (15.1*a*/15.2*a*) is spaced (D4.1, D4.2) with respect to the edge of a second tab (15.1*b*/15.2*b*) positioned next the said first tab (15.1*a*/15.2*a*) in order to form second through openings (17.1/17.2).

Aspect 6. A sensor assembly according to aspect 1 or 2, characterized by the fact to comprise at least two tabs (15.1*b*, 15.1*c*) positioned opposite each other with their respective free ends arranged head to head.

Aspect 7. A sensor assembly according to aspect 6, characterized by the fact that the free ends of said two tabs (15.1*b*, 15.1*c*) are spaced apart in order to form third through openings (19.1).

Aspect 8. A sensor assembly according to aspect 1 or 2, characterized in that of comprising at least two tabs (15.2*a*, 15.2*b*) positioned side by side with the respective free ends arranged opposite each other.

Aspect 9. A sensor assembly according to aspect 1 or 2, characterized in that one or more tabs (15.2) have their respective free ends rounded.

Aspect 10. A sensor assembly according to one of the preceding aspects, characterized in that said tabs (15.1/15.2) are flexible.

Aspect 11. A sensor assembly according to one of the preceding aspects, characterized in that said first tubular section (10.1/10.2) is made by means of a preformed double-sided plain copper PCB.

Aspect 12. A sensor assembly according to one of the previous aspects, characterized by the fact to further comprising a second tubular section (20.1/20.2); by the fact that said second tubular section (20.1/20.2) is positioned axially at the side of a first axial end (10*sx*) of the first tubular section (10.1/10.2); and by the fact that said second tubular section (20.1/20.2) may function as an electric screen.

Aspect 13. A sensor assembly according to one of the preceding aspects, characterized by the fact that it further comprises a third tubular section (30.1/30.2); by the fact that said third tubular section (30.1/30.2) is positioned axially at the side of a second axial end (10*dx*) of the first tubular section (10.1/10.2); and by the fact that said third tubular section (30.1/30.2) may function as an electric screen.

Aspect 14. A sensor assembly according to aspect 12 or 13, characterized by the fact that said second tubular section (20.1/20.2) and/or said third tubular section (30.1/30.2) are associated with said first tubular section (10.1/10.2).

Aspect 15. A sensor assembly according to one of aspects 1 to 14, characterized by the fact said second tubular section (20.1 1 20.2) and/or said third tubular section (30.1 1 30.2) are made by wire mesh.

Various features of the disclosure are set forth in the following claims.

What is claimed is:

1. A sensor assembly comprising:
a connecting bar extending along a longitudinal axis; and
a tubular body extending along the longitudinal axis and at least partially surrounding the connecting bar such that the tubular body is radially spaced from the connecting bar, the tubular body including
a first skirt portion,
a first plurality of cantilevered tabs extending from the first skirt portion in a first direction parallel to the longitudinal axis,
a second skirt portion, and
a second plurality of cantilevered tabs extending from the second skirt portion in a second direction opposite the first direction.

2. The sensor assembly of claim 1, wherein the tubular body includes a connecting segment extending between and interconnecting the first skirt portion and the second skirt portion.

3. The sensor assembly of claim 1, wherein a first tab of the first plurality of cantilevered tabs is spaced from the connecting segment to define a through hole therebetween.

4. The sensor assembly of claim 1, wherein each tab of the first plurality of cantilevered tabs includes a rounded free end.

5. The sensor assembly of claim 1, wherein each tab of the second plurality of cantilevered tabs includes a rounded free end.

6. The sensor assembly of claim 1, wherein a first tab of the first plurality of cantilevered tabs includes a first free end, wherein a second tab of the second plurality of cantilevered tabs includes a second free end, and wherein the first free end faces the second free end.

7. The sensor assembly of claim 6, wherein the first free end is spaced from the second free end to define a through hole therebetween.

8. The sensor assembly of claim 1, wherein a first tab of the first plurality of cantilevered tabs is spaced from a second tab of the second plurality of cantilevered tabs in a circumferential direction to define a through hole therebetween.

9. The sensor assembly of claim 1, wherein each tab of the first plurality of cantilevered tabs and the second plurality of cantilevered tabs includes a support member made of an insulating material, an inner layer made of an electrically conductive material, and an outer layer made of an electrically conductive material.

10. The sensor assembly of claim 1, further comprising a first screen coupled to the first skirt portion and a second screen coupled to the second skirt portion.

11. The sensor assembly of claim 10, wherein the first screen and the second screen are made of a metal mesh.

12. The sensor assembly of claim 1, further comprising a mass of dielectric material at least partially encapsulating the tubular body.

13. A sensor assembly comprising:
a connecting bar extending along a longitudinal axis; and
a tubular body extending along the longitudinal axis and at least partially surrounding the connecting bar such that the tubular body is radially spaced from the connecting bar, the tubular body including
a support member made of an insulating material, the support member including an inner surface and an outer surface opposite the inner surface,
an electric field sensor comprising a first layer of electrically conductive material disposed on the inner surface of the support member, the electric field sensor configured to detect an electric field produced by the connecting bar,
a first electric screen comprising a second layer of electrically conductive material disposed on the outer surface of the support member, the first electric screen configured to shield the electric field sensor from outside electrical interference, and
a plurality of cantilevered tabs having a first tab and a second tab spaced from the first tab to define a through hole therebetween,
wherein the through hole extends through support member, the first layer, and the second layer.

14. The sensor assembly of claim 13, wherein each tab of the plurality of cantilevered tabs includes a rounded free end.

15. The sensor assembly of claim 13, wherein the first tab includes a first free end, wherein the second tab includes a second free end, and wherein the first free end faces the second free end.

16. The sensor assembly of claim 13, further comprising a second electric screen coupled to the support member and a third electric screen coupled to the support member opposite the second electric screen.

17. The sensor assembly of claim 13, further comprising a mass of dielectric material at least partially encapsulating the tubular body.

18. A sensor assembly comprising:
a tubular body extending along a longitudinal axis, the tubular body including
a support member made of an insulating material,
a first layer of electrically conductive material disposed on an inner surface of the support member,
a second layer of electrically conductive material disposed on an outer surface of the support member,
a first skirt portion,
a first plurality of cantilevered tabs extending from the first skirt portion in a first direction parallel to the longitudinal axis,
a second skirt portion,
a second plurality of cantilevered tabs extending from the second skirt portion in a second direction opposite the first direction, and
a connecting segment extending between and interconnecting the first skirt portion and the second skirt portion.

19. The sensor assembly of claim 18, wherein a first tab of the first plurality of cantilevered tabs is spaced from a second tab of the second plurality of cantilevered tabs to define a through hole therebetween, the through hole extending through the support member, the first layer, and the second layer.

20. The sensor assembly of claim 19, wherein the first tab is circumferentially spaced from the second tab.

21. The sensor assembly of claim 19, wherein a free end of the first tab is axially spaced from a free end of the second tab.

* * * * *